(12) United States Patent
Cao et al.

(10) Patent No.: US 10,553,724 B2
(45) Date of Patent: Feb. 4, 2020

(54) ARRAY SUBSTRATE, METHOD FOR MANUFACTURING THE SAME, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Ke Cao, Beijing (CN); Tao Jiang, Beijing (CN); Chengshao Yang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Ahnui (CN)

( * ) Notice: Subject to any disclaimer, the term of this patent is extended or adjusted under 35 U.S.C. 154(b) by 41 days.

(21) Appl. No.: 15/756,958

(22) PCT Filed: Aug. 9, 2017

(86) PCT No.: PCT/CN2017/096628
§ 371 (c)(1),
(2) Date: Mar. 1, 2018

(87) PCT Pub. No.: WO2018/133391
PCT Pub. Date: Jul. 26, 2018

(65) Prior Publication Data
US 2019/0058064 A1 Feb. 21, 2019

(30) Foreign Application Priority Data
Jan. 20, 2017 (CN) .......................... 2017 1 0042098

(51) Int. Cl.
*H01L 29/10* (2006.01)
*H01L 31/036* (2006.01)
(Continued)

(52) U.S. Cl.
CPC .... *H01L 29/78633* (2013.01); *H01L 21/0273* (2013.01); *H01L 21/32135* (2013.01);
(Continued)

(58) Field of Classification Search
CPC .............. H01L 21/0273; H01L 21/321; H01L 21/32135; H01L 21/77; H01L 21/1222;
(Continued)

(56) References Cited

U.S. PATENT DOCUMENTS 5,773,848 A 6/1998 Wu et al.
9,397,122 B2 * 7/2016 Lim ...................... H01L 27/124
(Continued)

FOREIGN PATENT DOCUMENTS

CN 101533857 A 9/2009
CN 105374845 A 3/2016
(Continued)

OTHER PUBLICATIONS

International Search Report & Written Opinion, for PCT Patent Application No. PCT/CN2017/096628, dated Nov. 15, 2017, 11 pages.
(Continued)

*Primary Examiner* — Alonzo Chambliss
(74) *Attorney, Agent, or Firm* — Kinney & Lange, P.A.

(57) ABSTRACT

Embodiments of the present disclosure provide an array substrate, a method for manufacturing an array substrate and a display device. The array substrate includes a base substrate and a transistor disposed on the base substrate, and the transistor includes a gate electrode and an active layer. A light absorbing layer is formed on a side of the gate electrode
(Continued)

facing the active layer, and the light absorbing layer is configured to absorb light irradiated thereto.

19 Claims, 4 Drawing Sheets

(51) Int. Cl.

| | | |
|---|---|---|
| *H01L 31/0232* | (2014.01) | |
| *H01L 21/00* | (2006.01) | |
| *H01L 29/786* | (2006.01) | |
| *H01L 29/49* | (2006.01) | |
| *H01L 27/12* | (2006.01) | |
| *H01L 21/3213* | (2006.01) | |
| *H01L 21/027* | (2006.01) | |

(52) U.S. Cl.
CPC ........ *H01L 27/124* (2013.01); *H01L 27/1262* (2013.01); *H01L 27/1288* (2013.01); *H01L 29/4908* (2013.01)

(58) Field of Classification Search
CPC ............... H01L 21/124; H01L 21/1259; H01L 21/1262; H01L 21/1288; H01L 29/4908; H01L 51/5284
See application file for complete search history.

(56) References Cited

U.S. PATENT DOCUMENTS

| | | | |
|---|---|---|---|
| 9,859,355 B2 * | 1/2018 | Lim | ................ H01L 27/124 |
| 2008/0024479 A1 | 1/2008 | Jung et al. | |
| 2009/0230390 A1 | 9/2009 | Gosain et al. | |
| 2010/0148192 A1 * | 6/2010 | Jung | ................ H01L 27/3246 257/88 |
| 2014/0060640 A1 | 3/2014 | Hazama et al. | |
| 2014/0263945 A1 | 9/2014 | Huang et al. | |
| 2015/0310787 A1 * | 10/2015 | Fike | ................ G02B 26/02 345/55 |
| 2016/0049426 A1 | 2/2016 | Lim et al. | |
| 2017/0184931 A1 * | 6/2017 | Zhang | ................ G02F 1/133308 |
| 2017/0373282 A1 * | 12/2017 | Kim | ................ H01L 51/5281 |
| 2018/0269429 A1 * | 9/2018 | Kudo | ................ H01L 51/5284 |

FOREIGN PATENT DOCUMENTS

| | | |
|---|---|---|
| CN | 106653776 A | 5/2017 |
| JP | 2014049572 A | 3/2014 |
| KR | 20070121409 A | 12/2007 |

OTHER PUBLICATIONS

First Chinese Office Action dated Dec. 19, 2018, received for corresponding Chinese Application No. 2018121400937720.

* cited by examiner

ARRAY SUBSTRATE, METHOD FOR MANUFACTURING THE SAME, AND DISPLAY DEVICE

CROSS-REFERENCE TO RELATED APPLICATION

This application is a Section 371 National Stage Application of International Application No. PCT/CN2017/096628, filed on Aug. 9, 2017, entitled "ARRAY SUBSTRATE AND METHOD OF MANUFACTURING THE SAME, AND DISPLAY DEVICE", which claims priority to Chinese Application No. 201710042098.0, filed on Jan. 20, 2017 in the State Intellectual Property Office of China, incorporated herein by reference in their entirety.

TECHNICAL FIELD

Embodiments of the present disclosure generally relate to the field of display technology, and in particular, to an array substrate, a method for manufacturing an array substrate and a display device.

DESCRIPTION OF THE RELATED ART

Due to expensive exposure equipments, exposure processes have always been the focus of cost control in manufacturing a semiconductor device, including a display screen.

In order to save the exposure cost, in the conventional manufacturing processes of a thin film transistor (TFT) of an array substrate, an active layer and source/drain electrodes are formed by one exposure process. In this way, it saves a mask process, thereby having significant advantages in saving production process steps and exposure equipment costs.

However, such a process may cause the active layer to extend excessively relative to an underlying gate electrode pattern in such a way that a bottom gate electrode cannot completely block a backlight source from illuminating the active layer. The light rays of backlight entering the active layer may change switching characteristics of the thin film transistor (TFT), and make it unstable in the operation, thereby adversely affecting display effect and reliability of a display.

SUMMARY

In order to overcome or eliminate at least one of the above and other problems and deficiencies in the prior art, the present disclosure has been provided.

In an aspect, an embodiment of the present disclosure provides an array substrate, comprising a base substrate and a transistor disposed on the base substrate, the transistor comprising a gate electrode and an active layer, a light absorbing layer is formed on a side of the gate electrode facing the active layer, and the light absorbing layer is configured to absorb light irradiated thereto.

In an embodiment, a surface of the light absorbing layer is rugged.

In an embodiment, the light absorbing layer contains microcrystal grains of copper oxide and/or microcrystal grains of copper sulfide.

In an embodiment, a material of the gate electrode includes copper.

In an embodiment, the light absorbing layer and the gate electrode are formed into a one-piece structure or the light absorbing layer is separately formed on a surface of the gate electrode.

In an embodiment, the light absorbing layer has a black or dark gray color.

In an embodiment, the light absorbing layer has a thickness in a range of 10 nm to 30 nm.

In an embodiment, the transistor further comprises a source electrode and a drain electrode disposed in a same layer and located at a same side of and at opposite ends of the active layer respectively.

In an embodiment, the gate electrode is disposed above or below the active layer.

In another aspect, an embodiment of the present disclosure provides a display device, comprising the array substrate according to any one of the embodiments of the present disclosure.

In further another aspect, an embodiment of the present disclosure provides a method for manufacturing the array substrate, comprising steps of forming a pattern of the gate electrode and a pattern of the active layer respectively on the base substrate by a patterning process, and the method further comprises forming the light absorbing layer on a side of the pattern of the gate electrode facing the active layer.

In an embodiment, the forming the light absorbing layer on the side of the gate electrode pattern facing the active layer comprises: processing a surface material of the side of the gate electrode facing the active layer to form the light absorbing layer.

In an embodiment, the processing a surface material of the side of the gate electrode facing the active layer to form the light absorbing layer comprises: when forming the pattern of the gate electrode, continuing to, after photoresist on the pattern of the gate electrode has been ashed off, implement an ashing process to the pattern of the gate electrode so as to form the light absorbing layer on the side of the pattern of the gate electrode facing the active layer.

In an embodiment, a material of the gate electrode includes copper; and the ashing process to the pattern of the gate electrode comprises: etching the pattern of the gate electrode in a dry etching apparatus using plasma generated from sulfur hexafluoride gas and/or oxygen so that the surface material of the pattern of the gate electrode reacts to generate microcrystal grains of copper oxide and/or microcrystal grains of copper sulfide.

In an embodiment, the processing a surface material of the side of the gate electrode facing the active layer comprises making a surface of the light absorbing layer being rugged.

In an embodiment, the forming the light absorbing layer on a side of the pattern of the gate electrode facing the active layer comprises: depositing the light absorbing layer on a surface of the pattern of the gate electrode facing the active layer.

In an embodiment, the method further comprises a step of forming a pattern of a gate electrode line, the pattern of the gate electrode line and the pattern of the gate electrode being simultaneously formed by a gray tone mask process.

DETAILED DESCRIPTION OF EMBODIMENTS

In order to make the objectives, technical solutions, and advantages of the present disclosure clearer, the present disclosure will be further described in detail below with reference to the accompanying drawings. Apparently, the described embodiments are merely some but not all of the present disclosure. All other embodiments obtained by those skilled in the art based on the embodiments of the present disclosure without creative efforts shall fall within the scope of the present disclosure.

In addition, in the following detailed description, numerous specific details are set forth for the convenience of explanation, so as to provide a thorough understanding of the embodiments of the present disclosure. Apparently, however, one or more embodiments may be implemented without these specific details. In other cases, well-known structures and devices are schematically illustrated to simplify the drawings.

Figure 1:
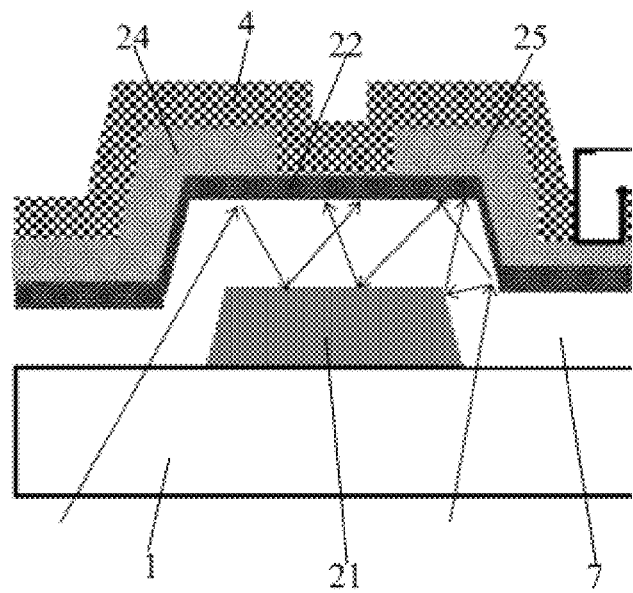
FIG. 1 is a structural cross-sectional view of a thin film transistor.
Figure 2:
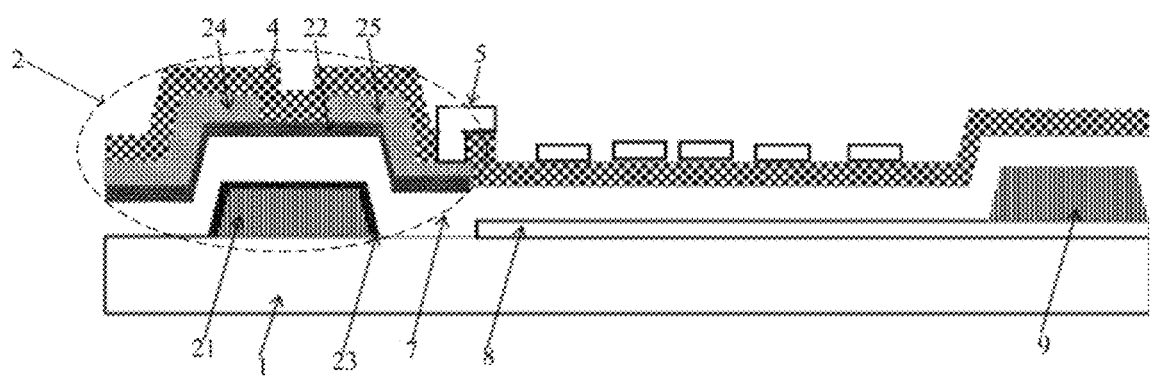
FIG. 2 is a cross-sectional view showing a structure of an array substrate according to an embodiment of the present disclosure.
Figure 3:
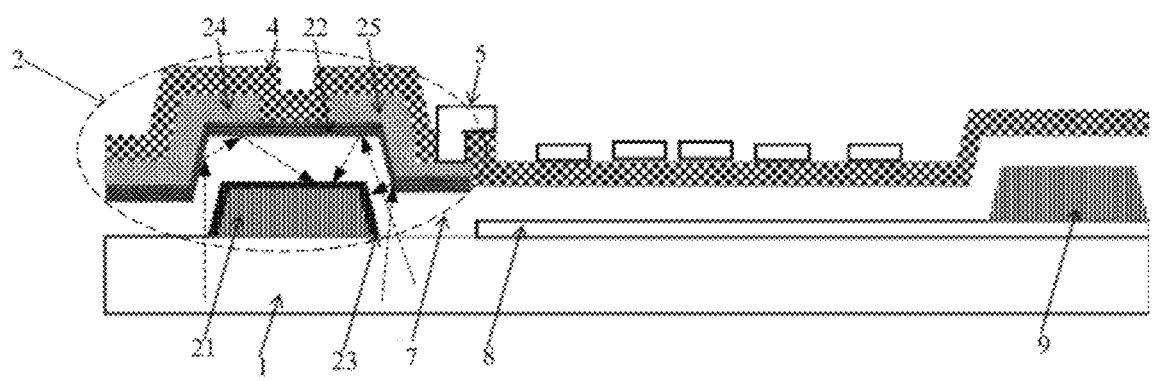
FIG. 3 is a schematic view showing absorption of light irradiated to a light absorbing layer by the light absorbing layer in FIG. 2.

In an embodiment of the present disclosure, it provides an array substrate, as shown in FIGS. 1-3, the array substrate includes a base substrate 1 and a transistor 2 disposed on the base substrate 1. The transistor 2 includes a gate electrode 21 and an active layer 22. In some examples, the transistor is a thin film transistor (TFT).

In some cases, as shown in FIG. 1, the gate electrode 21 may not completely block a backlight source from illuminating the active layer 22, and light rays of backlight entering the active layer may change switching characteristics of the transistor, and make it unstable in the operation, thereby adversely affecting display effect and reliability of a display. In addition, the gate electrode may re-reflect the light rays of backlight reflected back from the active layer, and allow the light rays of backlight to return to the active layer, so that the active layer is subjected to a "secondary irradiation", which will further increase adverse effects of the light rays of backlight on the active layer.

In some embodiments of the present disclosure, as shown in FIGS. 2 and 3, a light absorbing layer 23 is formed on a side of the gate electrode 21 facing the active layer 22. The light absorbing layer 23 can absorb light irradiated thereto. By way of example, the light absorbing layer 23 can absorb external light irradiated thereto, particularly light rays from a backlight source.

According to the embodiments of the present disclosure, by mans of forming the light absorbing layer on the side of the gate electrode facing the active layer, the light absorbing layer can absorb the light rays of backlight irradiated thereto so as to prevent the gate electrode from re-reflecting light rays of backlight to the active layer after the light rays of backlight irradiated to the active layer are reflected onto the gate electrode. In this way, it reduces the light rays of backlight irradiated to the active layer, and therefore reduces the adverse effect of the light rays of backlight on the switching characteristics of the transistor, and finally ensures switching stability of the transistor and the display effect and reliability of the display device adopting the array substrate.

In an exemplary embodiment, the gate electrode is made from a material comprising copper. In some examples, the light absorbing layer may comprise microcrystal grains of copper oxide and/or microcrystal grains of copper sulfide. In other examples, a surface of the light absorbing layer may be uneven or rugged. For example, microcrystal grains in the light absorbing layer do not crystallize well, so that there are many uneven or rugged deficiencies on the surface of the light absorbing layer. The light absorbing layer in such a structure has a good absorption effect on the light rays of backlight irradiated thereto, thereby preventing the light rays of backlight irradiated thereto from being re-reflected.

In an embodiment, the light absorbing layer is formed by ashing (i.e., dry etching) a surface material on the side of the gate electrode facing the active layer. For example, the light absorbing layer and the gate electrode are formed into a one-piece structure. The material of the gate electrode is not limited to copper, and other conductive materials may also be used. Correspondingly, the material of the light absorbing layer may also be some other material components formed from the material of the gate electrode during the dry etching, as long as a structure capable of absorbing the light rays of backlight may be formed from the surface material on the side of the gate electrode facing the active layer by a dry etching process or other processes. In other examples, the light absorbing layer is separately formed on a surface of the gate electrode facing the active layer, or is in direct contact with and located on a surface of the gate electrode facing the active layer.

In an example, the light absorbing layer is black or dark gray in color. Black or dark gray color can further enhance the absorption effect of the light absorbing layer on the light rays of backlight, improving absorption effectiveness of the light absorbing layer on the light rays of backlight.

In an embodiment, the gate electrode 21 is disposed below the active layer 22, as shown in FIGS. 1-3. That is to say, the transistor in this embodiment is a bottom-gate electrode transistor.

In an example, the light absorbing layer has a thickness in a range of 10 nm to 30 nm. The light absorbing layer in such a range of thickness can absorb the light rays of backlight irradiated thereto more completely, thereby preventing the light rays of backlight irradiated to the gate electrode from being re-reflected to the active layer.

In some embodiments, the array substrate further includes a gate electrode line. The gate electrode line and the gate electrode 21 are formed from a same material and in a same layer. A source electrode 24 and a drain electrode 25 of the transistor 2 are disposed in a same layer and at opposite ends of a same side of the active layer 22 respectively, as shown in FIGS. 1-3. In some examples, the source electrode 24, the drain electrode 25 and the active layer 22 are formed by one exposure and patterning process. Compared with the current manufacturing method in which the active layer and the source electrode and the drain electrode are separately formed by exposure processes, it can save one mask process. However, in this way, the formed active layer extends excessively relative to the gate electrode pattern corresponding thereto, that is, the pattern size of the active layer is much larger than the pattern size of the gate electrode. Thus, the gate electrode located close to the light rays of backlight cannot completely block the light rays of backlight from illuminating the active layer, a part of the light rays of backlight will be directly irradiated onto the active layer, and then reflected from the active layer to the gate electrode. In the embodiments of the present disclosure, the light absorbing layer 23 formed on the side of the gate electrode 21 facing the active layer 22 can absorb this part of reflected light rays effectively and prevent this part of reflected light rays from being re-reflected to the active layer 22, thereby avoiding further adverse affect of the reflected light rays of backlight on the switching characteristics of the transistor 2.

In some embodiments, as shown in FIGS. 1-3, the array substrate further includes a passivation layer 4 and a pixel electrode 5. The passivation layer 4 is disposed over the source electrode 24 and the drain electrode 25, the pixel electrode 5 is disposed on the passivation layer 4, and the pixel electrode 5 is connected to the drain electrode 25 through a via hole provided in an area of the passivation layer 4 corresponding to the drain electrode 25. In some other embodiments, as shown in FIGS. 1-3, the array substrate further includes a common electrode 8, a common electrode line 9 and a gate insulation layer 7. The common electrode 8 is located below the common electrode line 9 and electrically connected to the common electrode line 9, the gate insulation layer 7 is disposed between the gate electrode 21 and the active layer 22. Exemplarily, the light absorbing layer 23 is located between the gate electrode 21 and the gate insulation layer 7. In an example, the common electrode line 9 and the gate electrode line are disposed in a same layer and insulated from each other.

Based on the above structure of the array substrate, an embodiment of the present disclosure further provides a method for manufacturing an array substrate, as shown in FIG. 4 to FIG. 9, the method comprises steps of respectively forming a pattern of a gate electrode 21 and a pattern of an active layer on a base substrate 1 by a patterning process. While forming the pattern of the gate electrode 21, after photoresist on the pattern of the gate electrode 21 has been ashed off, an ashing (for example, dry etching) process is implemented to the pattern of the gate electrode 21 so as to form a light absorbing layer 23 on a side of the pattern of the gate electrode 21 facing the active layer.

In this embodiment, the method for manufacturing an array substrate further includes a step of forming a pattern of a gate electrode line 3, the pattern of the gate electrode line 3 and the pattern of the gate electrode 21 are simultaneously formed by a gray tone mask process.

Figure 4:
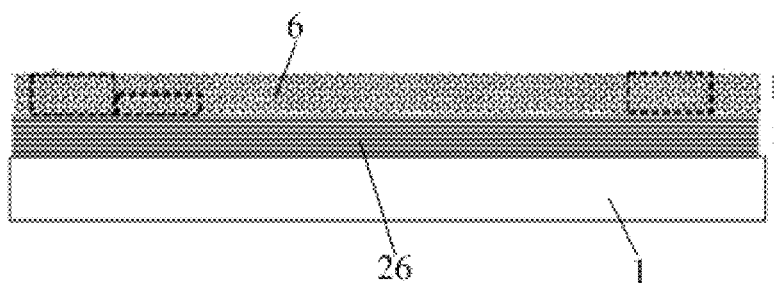
FIGS. 4-9 are schematic cross-sectional views of a method for manufacturing an array substrate according to an embodiment of the present disclosure, showing structures formed in various steps of the method respectively.

In an embodiment, forming the pattern of the gate electrode 21 may include the following steps:

Step S101: depositing a gate electrode film 26 on the base substrate 1 and applying photoresist 6 on the gate electrode film 26 (as shown in FIG. 4).

In an example, the photoresist 6 is positive photoresist. Alternatively, negative photoresist may also be used in other examples, depending on process requirements such as exposure, development, and the like.

Figure 5:
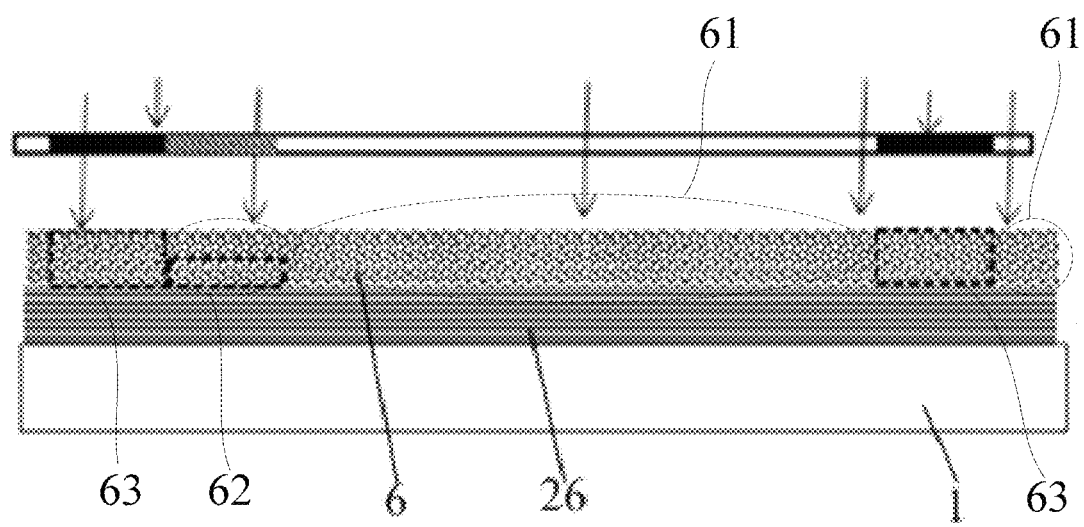

Step S102: exposing the photoresist 6 by using a gray tone mask, specifically, completely exposing a portion of the photoresist 6 which does not correspond to the pattern of the gate electrode, the pattern of the gate electrode line and the pattern of a common electrode line (e.g., a portion 61 shown in FIG. 5); partially exposing a portion of the photoresist 6 corresponding to the pattern of the gate electrode (e.g., a portion 62 shown in FIG. 5); and implementing no exposure to a portion of the photoresist 6 corresponding to the pattern of the gate electrode line and the pattern of the common electrode line (e.g., a portion 63 shown in FIG. 5), as shown in FIG. 5.

Figure 6:
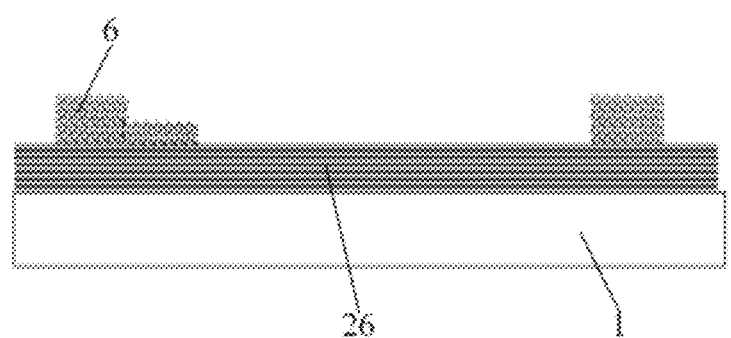

Step S103: after completing the step S102, implementing a developing process to the photoresist 6 on the substrate 1, so that the portion of the photoresist 6 which does not correspond to the pattern of the gate electrode, the pattern of the gate electrode line and the pattern of the common electrode line is removed the portion of the photoresist 6 corresponding to the pattern of the gate electrode is partially remained, and the portion of the photoresist 6 corresponding to the pattern of the gate electrode line and the pattern of the common electrode line is completely remained (as shown in FIG. 6).

Figure 7:
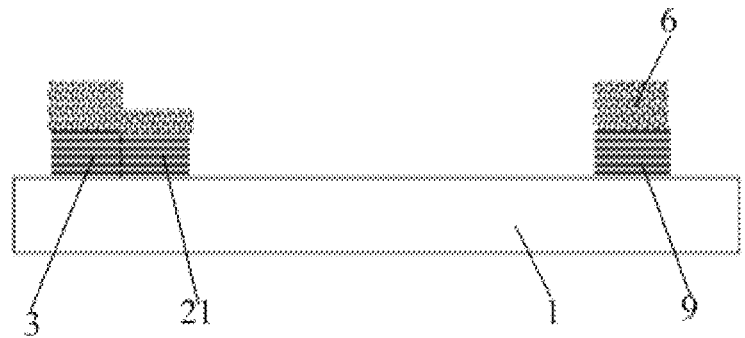

Step S104: removing portions of the gate electrode film 26 which do not correspond to the pattern of the gate electrode 21, the pattern of the gate electrode line 3, and the pattern of the common electrode line 9 (as shown in FIG. 7). In an example, an etching process, such as wet etching, may be performed to remove this portion of the gate electrode film.

Figure 8:

Step S105: after completing the step S104, implementing an ashing process to the photoresist 6 on the substrate 1, so that the portion of the photoresist 6 corresponding to the pattern of the gate electrode 21 is removed, and the portion of the photoresist 6 corresponding to the pattern of the gate electrode line 3 and the pattern of the common electrode line 9 is partially remained (as shown in FIG. 8).

Figure 9:
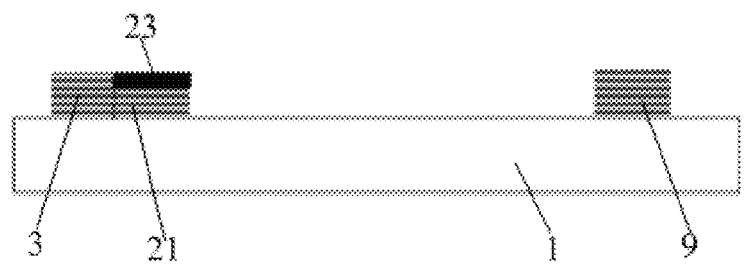

Step S106: after completing the step S105, removing a portion of the photoresist 6 on the pattern of the gate electrode 21 on the base substrate 1 (for example, by an ashing process) and forming a light absorbing layer 23 on the surface of the gate electrode 21; and finally, removing the photoresist 6 on the pattern of the gate electrode line 3 and the pattern of the common electrode line 9 (as shown in FIG. 9).

In some embodiments, the surface material of the pattern of the gate electrode 21 may be processed to form the light absorbing layer 23, thereby the light absorbing layer 23 and the gate electrode 21 are formed into a one-piece structure or an integral structure. For example, the material of the gate electrode 21 may include copper. As an example, the step of processing the surface material of pattern of the gate electrode 21 to form the light absorbing layer 23 may include etching the pattern of the gate electrode 21 in a dry etching apparatus using plasma generated from sulfur hexafluoride gas and/or oxygen so that the surface material of the pattern of the gate electrode 21 reacts to generate microcrystal grains containing copper oxide and/or microcrystal grains containing copper sulfide. These microcrystal grains cannot crystallize well, so that the surface of the pattern of the gate electrode 21 eventually becomes uneven or rugged, while the processed surface material of the pattern of the gate electrode 21 is black or dark gray in color. The light absorbing layer 23 with such a structure and color can effectively absorb the light rays of backlight irradiated thereto, so as to prevent the light rays of backlight irradiated to the side of the gate electrode 21 facing the active layer from being re-reflected to the active layer. In this way, it reduces the light rays of backlight irradiated to the active layer, and therefore reduces the adverse effect of the light rays of backlight on the switching characteristics of the transistor. In other embodiments, a light absorbing material may be used to form (for example, deposit) a suitable light absorbing layer on the pattern of the gate electrode 21, such that the light absorbing layer is separately formed on a surface of the gate electrode facing the active layer, or is in direct contact with and located on a surface of the gate electrode facing the active layer.

It should be noted that, in this step, the photoresist 6 on the pattern of the gate electrode line 3 and the pattern of the common electrode line 9 may be removed while the pattern of the gate electrode 21 is being processed (for example, dry-etched), or may be peeled off by a peeling-off process after the processing of the pattern of the gate electrode 21 is completed or the light absorbing layer is formed on the pattern of the gate electrode 21.

In addition, in some examples, the ashing process in the step S105 may also be a process of etching the photoresist 6 using plasma generated from sulfur hexafluoride gas and oxygen in a dry etching apparatus, and the photoresist 6 is removed after the etching.

In some embodiments, the method for manufacturing the array substrate further includes steps of sequentially forming, by patterning process(es), a source electrode, a drain electrode, a passivation layer and a pixel electrode on the substrate 1 formed with the pattern of the active layer; in some examples, the method for manufacturing the array substrate further includes a step of forming a common electrode on the substrate 1 by a patterning process before the pattern of the gate electrode 21 and the pattern of the gate electrode line 3 are formed; the method for manufacturing the array substrate may further include a step of forming a gate insulation layer over the substrate 1 formed with the gate electrode 21 and the gate electrode line 3 by a patterning process after the pattern of the gate electrode 21 and the pattern of the gate electrode line 3 are formed.

Another embodiment of the present disclosure provides an array substrate. Unlike the above embodiments, the gate electrode is disposed above the active layer, that is, the transistor in this embodiment is a top-gate electrode transistor. Also, in this embodiment, a light absorbing layer is also formed on a side of the gate electrode facing the active layer. The light absorbing layer disposed on the side of the gate electrode facing the active layer can also absorb the light rays of backlight irradiated thereto so as to prevent the light rays of backlight irradiated to the side of the gate electrode facing the active layer from being re-reflected to the active layer. In this way, it reduces the light rays of backlight irradiated to the active layer, and finally reduces the adverse effect of the light rays of backlight on the switching characteristics of the transistor.

Correspondingly, the method for manufacturing the array substrate in this embodiment is different from the above embodiments in that: an active layer is firstly formed on a base substrate by a patterning process, then a gate insulation layer is formed, and thereafter a light absorbing layer and a pattern of a gate electrode are formed by a patterning process on the base substrate formed with the gate insulation layer such that the light absorbing layer is located on the side of the gate electrode facing the active layer (facing the gate insulation layer).

In some examples, the step of forming the light absorbing layer and the pattern of the gate electrode on the base substrate formed with the gate insulation layer may include: firstly forming (for example, depositing) a layer of material film on the based substrate formed with the gate insulation layer, and applying photoresist on the material film; in some examples, material of the material film may be the same as the material of the gate electrode to be formed, and the formed material film may be a thin layer, for example, having a thickness of 10 nm to 30 nm, so that it facilitates the formation of the light absorbing layer by treatment (such as ashing, dry etching, etc.); then removing, by exposure and development, a portion of the photoresist which does not correspond to the pattern of the gate electrode; next, ashing a portion of the photoresist corresponding to the pattern of the gate electrode by an ashing process, and after completing the ashing of the photoresist, continuing to process (for example, ash or dry-etch) a portion of the material film corresponding to the pattern of the gate electrode, and eventually forming a pattern of a light absorbing layer. In some examples, the specific method of processing the portion of the material film corresponding to the pattern of the gate electrode may be the same as those described in the above embodiments, and therefore will not be described herein again. Thereafter, a pattern of a gate electrode and a pattern of a gate electrode line are formed by patterning process(es) on the base substrate formed with the light absorbing layer. The formation of the pattern of the gate electrode and the pattern of the gate electrode line may be implemented by a conventional patterning process, which will not be described herein again. In other examples, material of the material film may also be a light absorbing material so that the light absorbing layer can be formed without performing the above-described processes.

The other structures of the array substrate and the other steps of the method for manufacturing the array substrate in this embodiment may be the same as those in the above embodiments, therefore they will not be described herein again.

In the array substrate according to the embodiments of the present disclosure, by mans of forming the light absorbing layer on the side of the gate electrode facing the active layer, the light absorbing layer can absorb the light rays of backlight irradiated thereto so as to prevent the gate electrode from re-reflecting light rays of backlight to the active layer after the light rays of backlight irradiated to the active layer are reflected onto the gate electrode. In this way, it reduces the light rays of backlight irradiated to the active layer, and therefore reduces the adverse effect of the light rays of backlight on the switching characteristics of the transistor, and finally ensures switching stability of the transistor and the display effect and reliability of a display device adopting the array substrate.

An embodiment of the present disclosure further provides a display device, comprising the array substrate according to any one of the embodiments of the present disclosure.

By means of the array substrate according to the embodiments of the present disclosure, the display stability of the display device is improved, and further the display effect and reliability of the display device are improved.

The display device according to the present disclosure may be any product or component having a display function, such as a liquid crystal panel, a liquid crystal television, a display, a mobile phone, a navigator or the like.

It can be understood that the above embodiments are merely exemplary embodiments used for explaining the principle of the present disclosure, but the present disclosure is not limited thereto. Various modifications and improvements may be made by those skilled in the art without departing from the spirit and scope of the present disclosure, and these modifications and improvements are also intended to be included in the scope of the present disclosure.

What is claimed is:

1. An array substrate, comprising a base substrate and a transistor on the base substrate, the transistor comprising a gate electrode and an active layer, wherein a light absorbing layer is formed on or in a surface of the gate electrode facing the active layer, and the light absorbing layer is configured to absorb light irradiated thereto, and the light absorbing layer contains microcrystal grains of copper oxide and/or microcrystal grains of copper sulfide.

2. The array substrate according to claim 1, wherein a surface of the light absorbing layer is rugged.

3. The array substrate according to claim 2, wherein the light absorbing layer and the gate electrode are formed into a one-piece structure or the light absorbing layer is separately formed on the surface of the gate electrode.

4. The array substrate according to claim 1, wherein a material of the gate electrode includes copper.

5. The array substrate according to claim 1, wherein the light absorbing layer and the gate electrode are formed into a one-piece structure or the light absorbing layer is separately formed on a surface of the gate electrode.

6. The array substrate according to claim 1, wherein the light absorbing layer has a black or dark gray color.

7. The array substrate according to claim 1, wherein the light absorbing layer has a thickness in a range of 10 nm to 30 nm.

8. The array substrate according to claim 1, wherein the transistor further comprises a source electrode and a drain electrode disposed in a same layer and located at a same side of the active layer and at opposite ends of the active layer respectively.

9. The array substrate according to claim 1, wherein the gate electrode is above or below the active layer.

10. A display device, comprising the array substrate according to claim 1.

11. A method for manufacturing the array substrate of claim 1, comprising steps of forming a pattern of the gate electrode and a pattern of the active layer respectively on the base substrate by a patterning process, wherein the method further comprises forming the light absorbing layer on or in a surface of the pattern of the gate electrode facing the active layer, the light absorbing layer containing microcrystal grains of copper oxide and/or microcrystal grains of copper sulfide.

12. The method according to claim 11, wherein forming the light absorbing layer on or in the surface of the gate electrode pattern facing the active layer comprises:

processing a surface material of the surface of the gate electrode facing the active layer to form the light absorbing layer.

13. The method according to claim 12, wherein processing the surface material of the surface of the gate electrode facing the active layer to form the light absorbing layer comprises:

when forming the pattern of the gate electrode, continuing to, after photoresist on the pattern of the gate electrode has been ashed off, implement an ashing process to the pattern of the gate electrode so as to form the light absorbing layer on the surface of the pattern of the gate electrode facing the active layer.

14. The method according to claim 13, wherein a material of the gate electrode includes copper; and the ashing process to the pattern of the gate electrode comprises: etching the pattern of the gate electrode in a dry etching apparatus using plasma generated from sulfur hexafluoride gas and/or oxygen so that the surface material of the pattern of the gate electrode reacts to generate the microcrystal grains of copper oxide and/or the microcrystal grains of copper sulfide.

15. The method according to claim 12, wherein processing the surface material of the surface of the gate electrode facing the active layer comprises making a surface of the light absorbing layer rugged.

16. The method according to claim 13, wherein processing the surface material of the surface of the gate electrode facing the active layer comprises making a surface of the light absorbing layer rugged.

17. The method according to claim 11, wherein forming the light absorbing layer on the surface of the pattern of the gate electrode facing the active layer comprises:

forming separately a layer of a light absorbing material on the surface of the pattern of the gate electrode facing the active layer.

18. The method according to claim 17, wherein forming separately the layer of the light absorbing material on the surface of the pattern of the gate electrode facing the active layers comprises:

depositing the layer of the light absorbing material on the surface of the pattern of the gate electrode facing the active layer.

19. The method according to claim 11, further comprising a step of forming a pattern of a gate electrode line, the pattern of the gate electrode line and the pattern of the gate electrode being simultaneously formed by a gray tone mask process.

* * * * *